(12) United States Patent
Figueredo

(10) Patent No.: US 6,728,653 B1
(45) Date of Patent: Apr. 27, 2004

(54) METHOD FOR TESTING MULTI-CHIP PACKAGES

(75) Inventor: Jorge Humberto Figueredo, Chula Vista, CA (US)

(73) Assignee: Unisys Corporation, Blue Bell, PA (US)

(*) Notice: Subject to any disclaimer, the term of this patent is extended or adjusted under 35 U.S.C. 154(b) by 0 days.

(21) Appl. No.: 09/531,860

(22) Filed: Mar. 21, 2000

(51) Int. Cl.[7] .............................................. G01R 31/02
(52) U.S. Cl. ...................... 702/117; 702/130; 324/703; 324/760
(58) Field of Search .......................... 702/99, 117, 118, 702/119, 120, 130, 133, 134, 135, 136, 121; 324/703, 760

(56) References Cited

U.S. PATENT DOCUMENTS

| | | | | |
|---|---|---|---|---|
| RE32,625 E | * | 3/1988 | Schwarz et al. | 374/57 |
| 4,739,258 A | * | 4/1988 | Schwarz | 324/537 |
| 4,792,683 A | * | 12/1988 | Chang et al. | 250/341.6 |
| 4,938,410 A | * | 7/1990 | Kondo | 228/180.1 |
| 5,107,325 A | * | 4/1992 | Nakayoshi | 257/793 |
| 5,260,668 A | * | 11/1993 | Mallory et al. | 324/719 |
| 5,290,710 A | * | 3/1994 | Haj-Ali-Ahmadi et al. | 438/15 |
| 5,419,780 A | * | 5/1995 | Suski | 136/205 |
| 5,844,330 A | * | 12/1998 | Furukawa et al. | 307/100 |
| 5,924,289 A | * | 7/1999 | Bishop, II | 62/3.61 |
| 6,181,556 B1 | * | 1/2001 | Allman | 361/690 |
| 6,196,002 B1 | * | 3/2001 | Newman et al. | 62/3.7 |
| 6,226,994 B1 | * | 5/2001 | Yamada et al. | 62/3.7 |
| 6,329,831 B1 | * | 12/2001 | Bui et al. | 324/765 |

FOREIGN PATENT DOCUMENTS

| | | | | |
|---|---|---|---|---|
| JP | 10239373 A | * | 9/1998 | G01R/31/02 |
| JP | 10239373 A1 | * | 9/1998 | G01R/31/02 |

OTHER PUBLICATIONS

ESPEC Technology Report, "Special issue: Evaluating Reliability and Measurement System", Sep. 30, 1999.*

Love et al, High Density Packaging User Group International, "BGA Reliability Characterization Project Temperature Cycling Tests Final Report", Jan. 1999.*

* cited by examiner

*Primary Examiner*—Marc S. Hoff
(74) *Attorney, Agent, or Firm*—Alfred W. Kozak; Mark T. Starr; Lisa A. Rode (57) ABSTRACT

A specialized computer program is utilized to operate apparatus for testing internal components of an integrated circuit package. A Peltier-junction module is controlled so as to ramp-up and ramp-down the temperature of an integrated circuit package while reading out and plotting the power-bus-ground resistance of the package during the up-ramp and down-ramp cycles. The computer screen then indicates a characteristic graph for a properly working package and erratic graph for a package having a short circuit or open circuit components.

1 Claim, 9 Drawing Sheets

METHOD FOR TESTING MULTI-CHIP PACKAGES

FIELD OF INVENTION

This disclosure concerns specialized methods for testing multi-chip packages in order to detect short-circuits on internal components without the need to open the part involved. This method can also be used to test parts on circuit boards.

BACKGROUND OF THE INVENTION

With the continued expansion of digital technology, more and more attention is being placed and developed on the digital circuitry components which are often found in multi-chip packages. Because of the miniature nature of the components within the multi-chip packages, it is essential that operational testing be effectuated in order to ensure the workability and reliability of a given package. These packages are actually manufactured using multi-layer printed circuit board elements that have materials which could be combustible.

Even after the normal testing methods have been used on the multi-chip packages, it was often found that some of the package parts would actually burst into flames right on the boards of the customers' product. The fact that there were certain bad parts in the packages which could fail with later use was not easy to detect because, for example, in order to detect a possible short-circuit within the package it was normally necessary to power-up the package and run the risk of burning the entire part.

The short circuits that cause parts to burst into flames were often found on the power bus and because of the already-low resistance of the power bus, it was very difficult, if not impractical, to detect any potential shorts.

It was often more difficult to detect or test the parts which were already placed on the boards. For example, there may be four packages on each board (multi-chip packages), plus also the extra components already on the printed circuit board. It was most desirable to conceive and find some method or system for testing these multi-chip packages before they were delivered for us to a customer in order to ensure reliability and safety factors which might be involved.

As a result, it was conceived that there was the possibility of monitoring the resistance (across the power bus) versus the temperature on a multi-chip package, which could possibly provide a way to detect potential internal shorts even while the packages were mounted on the printed circuit boards. It had been found that the short-circuitry on the internal parts were a result of poor contacts caused by excessive conductive epoxy which would later become short circuits when exposed to heat. It was then seen that monitoring the power bus resistance versus the temperature of a multi-chip package, here could be a way to detect potential short-circuits even when the packages were mounted on printed circuit boards.

It was understood that the normal bus resistance offered a rather linear change against temperature. It was expected that poor or shorted contacts would have an erratic behavior when exposed to heat and therefore, it was possible that by monitoring the total resistance of the power bus that any non-linear component should then be detectable.

As a result of a devised method, it was then found possible to detect short-circuits on components that were normally conceived to have an undetectable effect on the power bus. Thus, just about any component connected directly or indirectly between the internal power bus and ground would have an influence on the power bus resistance to ground and especially so if the component was shorted directly or intermittently by the epoxy used to mount the component. Thus the power bus to ground resistance could indicate a problem at any given temperature of the package.

As a result of the above concepts, the multi-chip circuit package components on the printed circuit boards could be tested without the need to remove them from the printed circuit board, thus saving much time and expense.

SUMMARY OF THE INVENTION

A Device Under Test (DUT) such as a multi-chip module is placed adjunct to an aluminum temperature Transfer Block. The aluminum Transfer Block is placed against a Peltier Thermal Electric Module, which is used as a heat pump and utilizes what is called the "Peltier" effect to move heat, as if it were a thermal electric cooler. The Peltier Thermal Electric Module is attached to a heat sink and fan.

A digital multi-meter is connected to a test socket for sensing the resistance occurring between a power bus (VCC) and ground, while a temperature meter is connected to the aluminum temperature Transfer Block. A programmable power supply controlled by a computer program is connected to regulate the Peltier Thermal Electric Module and a computer-controlled fan power supply regulates the fan above the heat sink above the Thermal Electric Module.

A personal computer is used to control the above modules in order to cycle an increasing temperature ramp followed by a decreasing ramp. A meter is used to read the Vcc to ground resistance as a function of the temperature change that occurs.

As a result of cycling the voltage-to-ground resistance and reading-out the relative temperature ramp changes, there is found to be a distinctive graph pattern between a module which is normal in operation and a module which has internal intermittent or complete electrical shorts or has a high potential of becoming inoperative.

BRIEF DESCRIPTION OF THE DRAWINGS

FIG. 6, (involving FIGS. 6A and 6B), is a flow chart illustrating the steps involved in exercising the device under test in a series of up ramp temperatures and down ramp temperatures, while continually measuring the power bus to ground resistance.

DESCRIPTION OF PREFERRED EMBODIMENT

Figure 1:
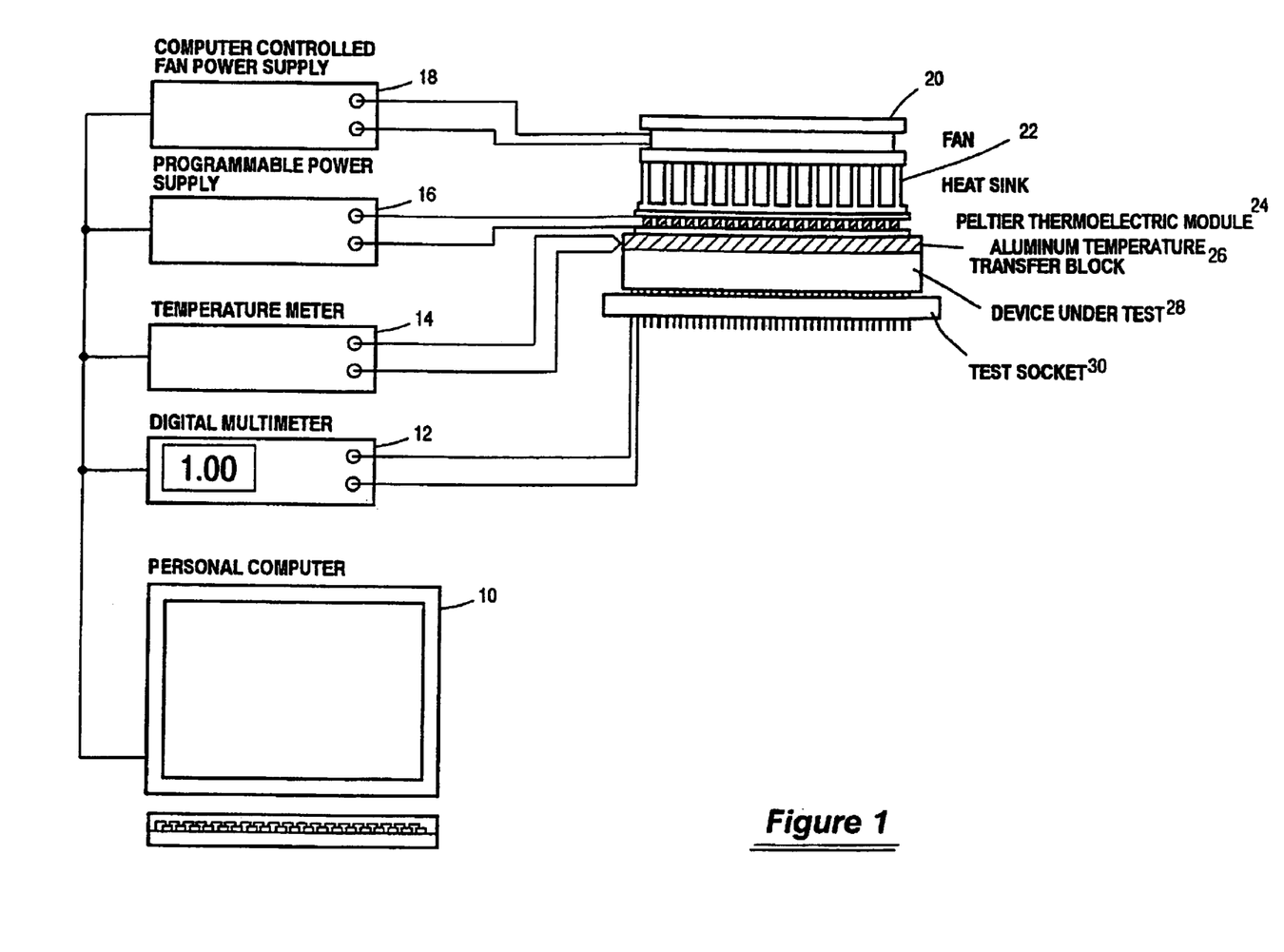
FIG. 1 is a diagram of the test set-up showing the modules involved for connecting to and monitoring the Device Under Test.

Referring to FIG. 1, a multi-chip package which is designated as a Device Under Test 28, is seen connected to a test socket 30. The test socket 30 is connected to a digital multi-meter 12 in order to monitor the resistance between two connection of the Device Under Test.

Placed upon the Device Under Test is an aluminum temperature Transfer Block 26, which is connected to a temperature meter 14 which can read the temperature of the aluminum temperature Transfer Block. Above, connected directly to the temperature Transfer Block, is a Peltier Thermal Electric Module 24 which is connected and regulated by a programmable power supply 16 controlled by the computer 10. Then, a heat sink 22 connects adjacent to the Peltier Thermal Electric Module and is supplied with a fan unit 20 which is controlled by a computer-controlled fan power supply 18.

Each of the modules 12, 14, 16, and 18, are controlled by software designed for this test. The software runs in a personal computer 10 shown providing control lines to each of these units.

A significant use in the test method is the use of a Thermal Electric Module 24 which uses the Peltier effect. The Peltier module involves the use of a flowing current, so that when a current flows across the junction of two unlike metals, this gives rise to either an absorption of heat or a liberation of heat. If the current flows in the same direction as the current at the hot junction of a thermal electric circuit of two metals, then heat is absorbed; if the current flows in the same direction as the current at the cold junction of the thermal electric circuit, then heat is liberated. The heat developed in a junction of two metals is proportional to the first power of the current, and of course, depends on the direction of the current. This feature enables control to be applied in order to develop heat to cause an increasing temperature ramp or to absorb heat to cause a cooling temperature ramp.

A Thermal Electric Module is a small solid-state device that can operate as a heat pump or as an electrical power generator. When used to generate electricity, the module is called a "Thermal Electric Generator" (TEC). When used as a heat pump, the module utilizes the Peltier effect to remove heat and is called a "Thermal Electric Cooler" (TEC).

The Thermal Electric Cooler consists of a number of p and n-type pairs or couples connected electrically in series and sandwiched between two plates. When connected to a DC power source, current causes the heat to move from one side of the thermal electric couple to the other. This creates a hot side on one side, and a cold side on the other side of the Thermal Electric Module. In a typical application, the cold side of the thermal electric module is exposed to the object or substance to be cooled, while the hot side is exposed to a heat sink which dissipates the heat to the environment.

The Thermal Electric Cooler (TEC) is a DC device. The amount of heat pumped through the TEC is directly proportional to the power supplied, and the temperature can be controlled through manual or automatic means. An automatic controller can range from a simple on-off thermostat to a complex computer-controlled feedback circuit which is done in the present testing method.

Thus, as was indicated in FIG. 1, a varying resistance of the component (which is connected between a power bus and ground) is measured via the test socket 30 from digital multi-meter 12. The Device Under Test 28 will then be subject to various levels of heat, as measured by the temperature meter 14 at the aluminum temperature Transfer Block 26. Here, the Peltier Thermal Electric Module 24, which is under control of the programmable power supply 16, add in or remove the heat via the heat sink 22. During this operation, the temperature meter 14 will be able to monitor and check the temperature condition of the Device under Test 28 as the test socket 30 monitors the resistance across the component in the package.

Then, as a result of the test pattern generated by sequencing the temperature a lower range to a higher range and vice versa and reading-out the resultant resistance variations, it can then be easily and readily verified as to whether the Device Under Test in properly operating without short-circuits or whether there are erratic or intermittent shorts occurring within the package.

Figure 2A:
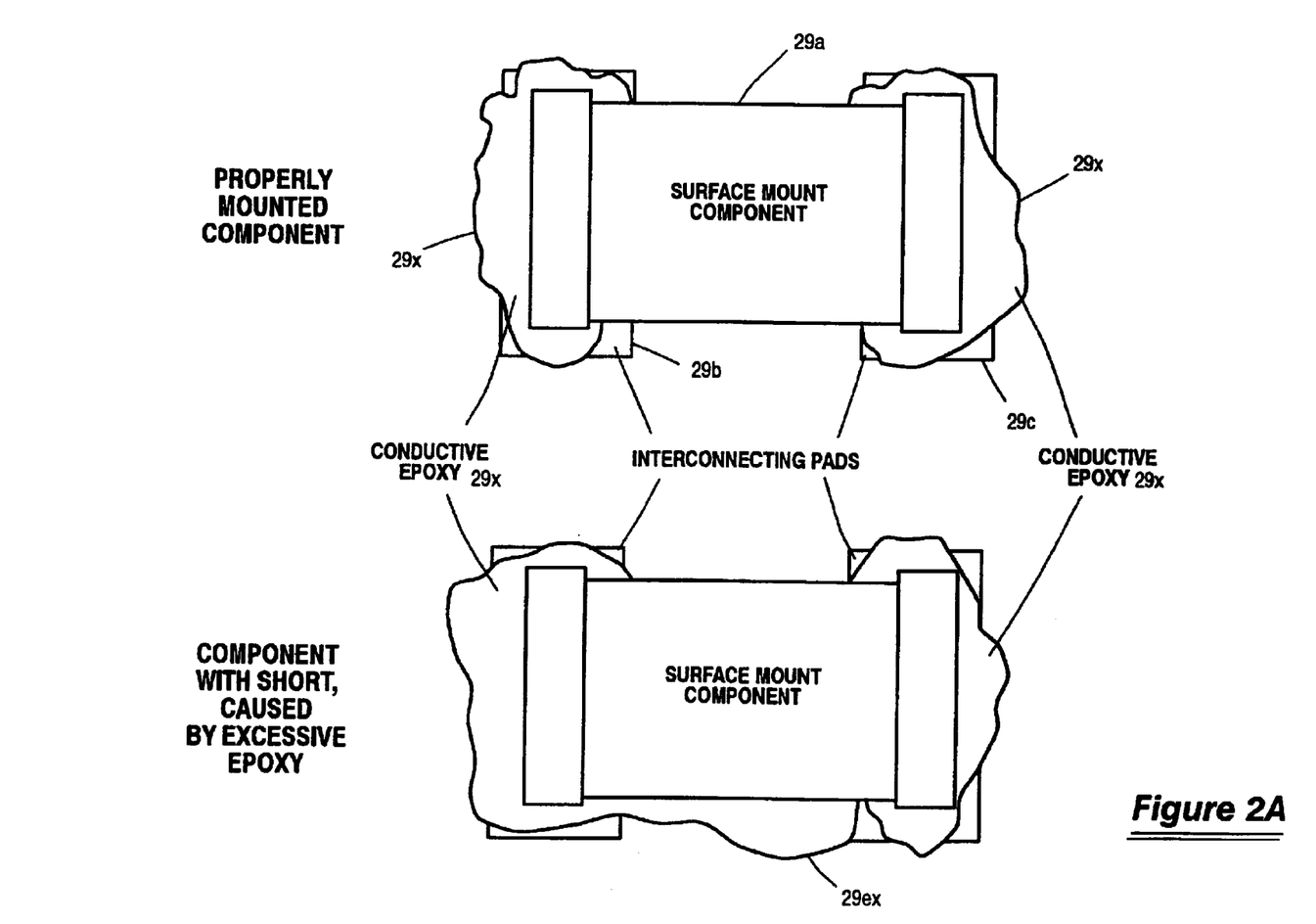
FIG. 2A is a view of a component from a multiple-chip Device Under Test which indicates how excess conductive epoxy can cause components to fail or result in a short-circuit.

FIG. 2A is an expanded sized illustration of a surface mount component which is inserted in a multi-chip integrated circuit, and one particular component is illustrated here as an example. For example, this surface mount component may be a capacitor which is of miniscule size such as one-eighth of an inch square. This tiny component will have metallic electrically conducting strips at each end and each end is then attached with conductive epoxy in order to make a proper electrical contact to terminals on the integrated circuit board. The upper illustration of FIG. 2A shows a properly mounted component in which the correct amount of epoxy to hold and electrically connect the service mount component to the connective terminals on the circuit board is illustrated.

Then the lower drawing in FIG. 2A shows an excessive amount of conductive epoxy 29ex having been applied to the end terminal metallic surfaces with the result of a spreading of the epoxy in an excessive manner thus causing a short circuit of the internal component which in this case is illustrated as a capacitor. When this occurs, this particular surface mount component will be unable to serve its purpose and the epoxy short will overheat and may even burst into flame.

Figure 2B:
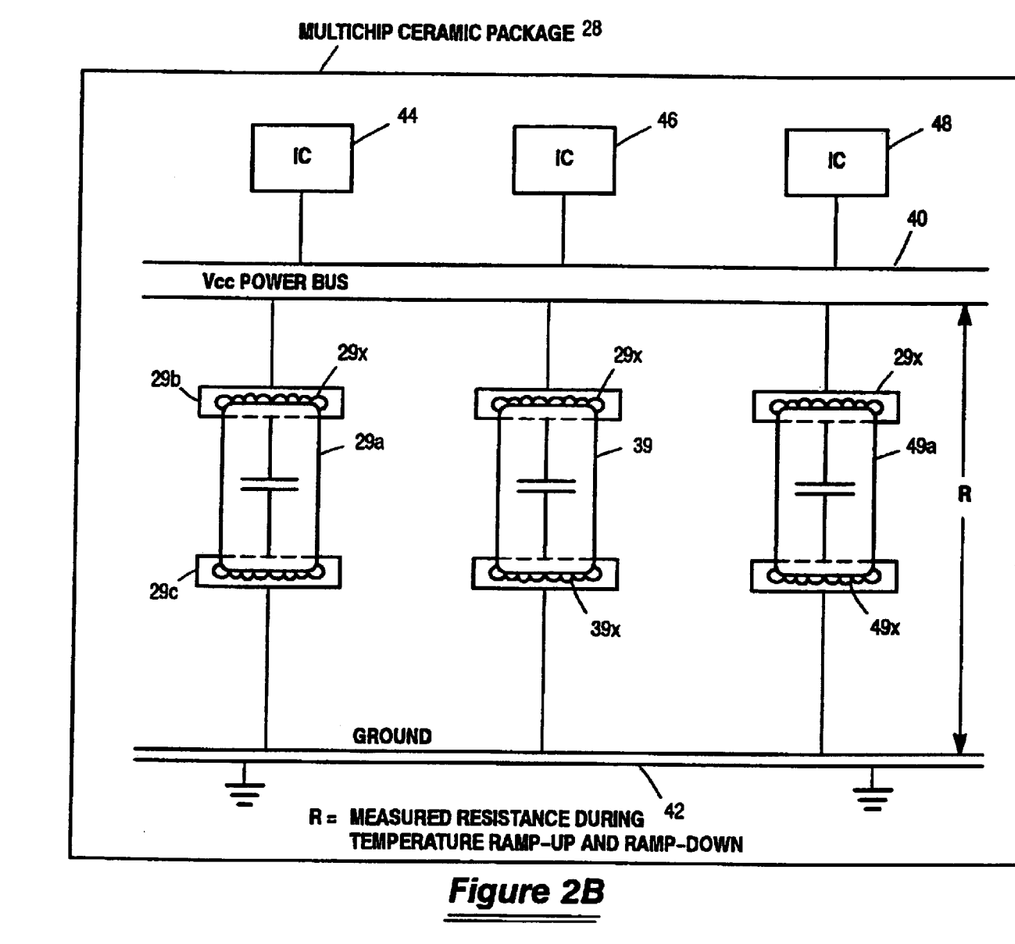
FIG. 2B is a schematic drawing showing how a component such as a miniscule capacitor is mounted via conductive epoxy and connected for a test run.

Now referring to FIG. 2B, an illustrative schematic is shown to illustrate some typical conditions of the multi-chip package 28.

The multi-chip package 28 is considered the device under test DUT. Running through the package is a power bus 40 which provides the collector voltage to various elements on the package. There may be a series of multiple chips connected to the power bus such as an integrated circuit 44, an integrated circuit 46, and an integrated circuit 48.

Then there are other components attached or connected to the power bus voltage and these are illustrated as specialized mounted components 29a, 39a, and 49a. In the illustration of FIG. 2B, these components are shown as capacitative elements wherein a capacitance is provided from the power bus 40 to the ground connection 42. Then for illustrative purposes, the component 29a is shown to have conductive epoxy 29x connected to the terminal pads 29b and 29c. The conductive epoxy 29x provides the electrical connection and mechanical holding connection of the component to the terminal pads 29b and 29c. However, should there be a spread of epoxy between the terminal pad 29b and 29c then, of course, there is a short circuit involved which will obviate the effect of the internal capacitance and nullify the action of the multi-chip package. Likewise, component 39a has epoxy 39x on terminal pads 39b and 39c; component 49a has epoxy 49x on terminal pads 49b and 49c.

It should be emphasized that these components, such as 29a, 39 and 49 are very tiny components often 1 ss than one-eighth of an inch square in size, and a very delicate operation is required in order to apply the proper amount of epoxy to make the 1 ctrical contact to the interconnecting pads without causing an excessive spread of epoxy which may short the component.

However, when such a multi-chip package is sealed there is no way ordinarily to tell what operating conditions are involved during power up and electrical operations.

However, the present testing method will utilize a procedure which will monitor the incremental resistance from the power bus to ground caused by the relative temperature change of the DUT. The power bus to ground resistance increases with each temperature increment.

TEST SEQUENCE: The device under test, that is to say the multi-chip package 28, is connected to a test socket 30 (FIG. 1) and an aluminum temperature Transfer Block 26.

The device under test is subjected to a temperature rise of about 20 to 30 degrees Celsius from room temperature and then returned back to room temperature while there is a monitoring of the Vcc to ground resistance of the device under test. The purpose and effect of the test is to detect non-linearity regarding the Vcc to ground resistance versus the temperature. Now referring to FIG. 1, a particular part number of the device is entered into the personal computer 10 while the device under test 28 is placed onto the test socket 30. The operator then presses a key on the computer in order to start the test. For example, by using a range of 20 degrees for the ramp temperature span, the up-ramp and down-ramp temperature cycle can be accomplished in less than 15 minutes for a complete test cycle.

The computer verifies that the DUT is properly inserted by monitoring the Vcc to ground resistance on that particular part. There is software in the computer to conduct the test and plot results.

Now, if the continuity test passes to show that the device under test has been properly connected, then the personal computer 10 initiates the test by ramping up the temperature of the device under test 28 by utilizing the thermal electric module assembly 24 and the programmable power supply 16. In this situation, the programmable power supply will pass current through the Peltier thermal electrical module 24 in order to generate heat. This heat is then passed through the aluminum temperature Transfer Block 26 over to the device under test.

Of course, while this is happening, the test socket connected to multimeter 12 then reads out the ohms of resistance between the power bus and ground related to the particular component of the multi-chip module which is under test.

A computer program (test program) controls the amount of power delivered to the thermal electric module (Peltier module) in order to approximate a straight line for the temperature rise.

Then the computer controls the cooling of the thermal electric module 24 by reversing the power to the thermoelectric module and controlling a cooling fan 20 to cause the temperature to drop on an approximate straight line.

As was previously mentioned, the Peltier thermal electric module controls a junction of two dissimilar metals wherein current in one direction will cause a heating effect while current in the opposite direction will cause a cooling effect.

Subsequently, when the temperature reaches down to room temperature, that is to say the starting temperature that was involved, then the test is terminated.

During the test, the Vcc to ground resistance is constantly monitored along with a temperature change. These parameters are then plotted on the computer monitor screen for evaluation and also at the same time a report is saved in a file for future reference.

The programmable power supply 16, the temperature meter 14, a thermal electric Peltier module 24, and a computer 10 are components of a servo loop. This servo loop allows the computer to control the up and the down ramping of the test temperature, in essence to try to follow a rather linear rise and a linear fall. The temperature meter 14 is used as feedback for the servo loop. The digital multimeter 12 is used to measure and collect the Vcc to ground resistance of device under test (DUT) during the test program.

The fan power supply 18 allows the computer 10 to control the on-off state of the fan 20. The fan is turned off when the tester is idle and turned on during the testing operation.

The personal computer 10 is used to control the testing operations by first ramping the temperature up and then ramping the temperature down on the device under test all the while monitoring the resistance involved from the power bus Vcc to ground. Here the computer 10 collects, saves, and plots the data for evaluation. Additionally, the computer 10 will be used to prompt the operator on the required actions.

The fan 20 is used to help the thermal electric module 24 maintain room temperature on the external side for faster response. The heat sink 22 is used to help the fan do a faster temperature transfer, that is to say, provide air to the thermal electric module and then vent the thermal electric module to air.

The Peltier thermal electric module 24 is used as a heat pump because it is easy to control and use, and it is easy to control also by a computer such as the computer 10. Further, it is easy to connect and easy to reverse its action from a heating to a cooling operation by just switching the power supply polarity from the programmable power supply 16.

The aluminum temperature Transfer Block 26 is used as an interface between the device under test 28 and the Peltier thermal electric module 24. The thermal electric module is generally made of two thin square pieces of ceramic. The test socket 30 is of the zero insertion force type and due to the high pin count of the device under test, it in necessary to use this type of socket in order to prevent damage to the device under test 28.

Figure 3A:
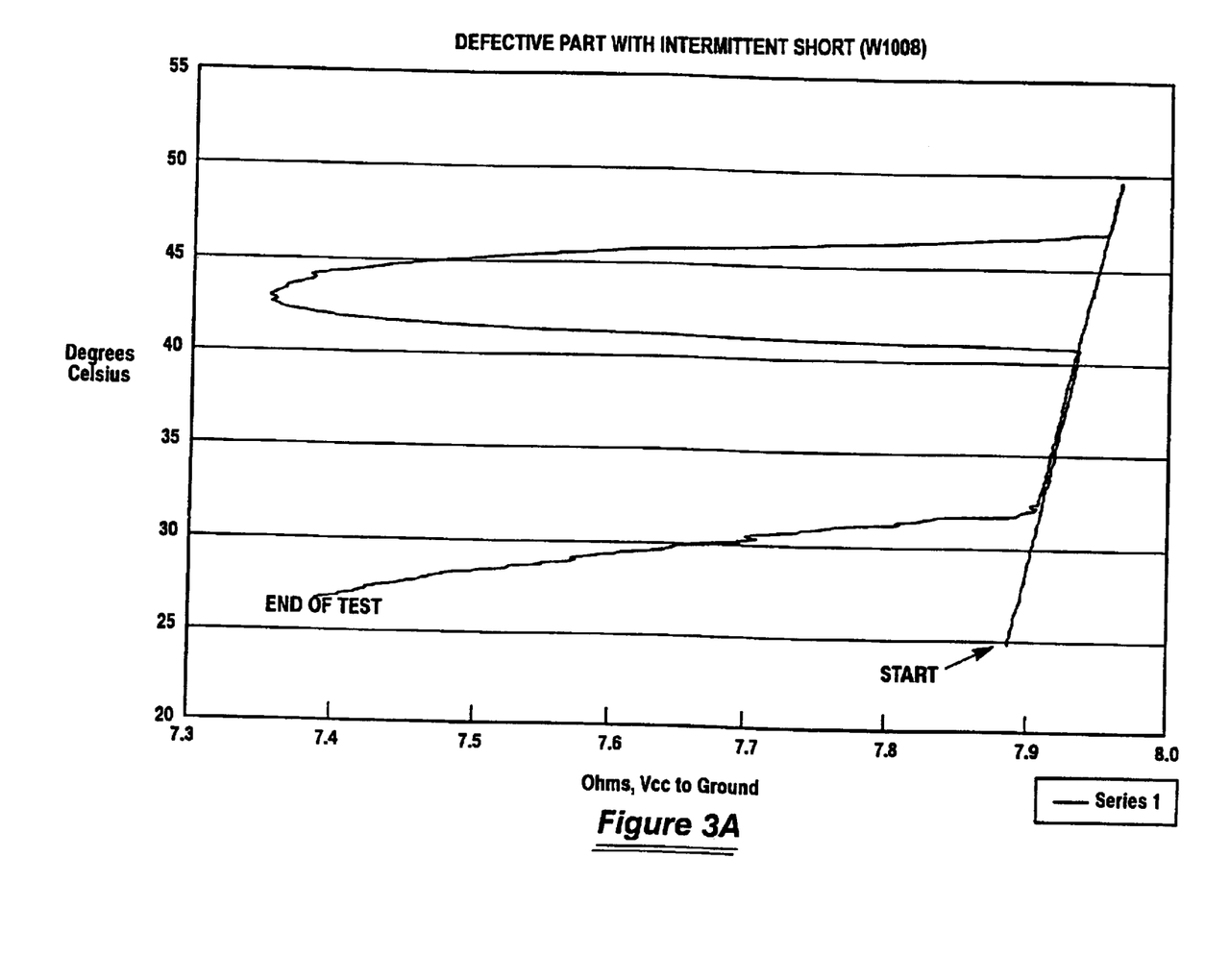
FIG. 3A is a drawing showing the test results of a defective part with an intermittent short showing the type of pattern when the voltage-to-ground resistance is measured against the relative temperature change during a ramp-up and ramp-down cycles.
Figure 3B:
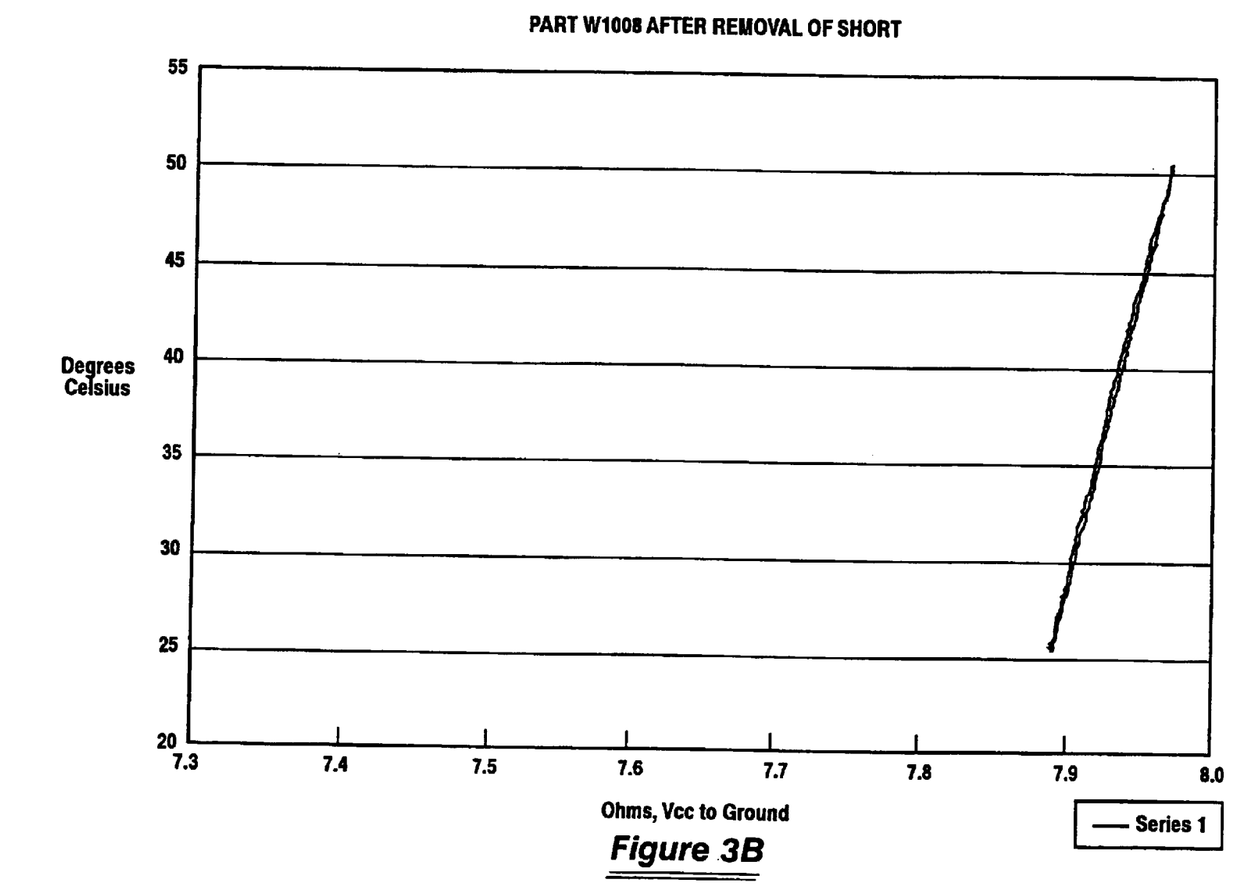
FIG. 3B shows the graph of the same part after removal of the short.

FIG. 3A is an example of an output graph which would indicate a defective part (designated W1008) having an intermittent short. Here it is noted that at the start of the test with the relative temperature being approximately ramped up from over a range of 20 to 30 degrees Celsius, it is seen that the power bus to ground resistance will rise then suddenly deteriorate and then return up to a higher level and eventually drop down to a lower level. FIG. 3B shows the same test cycle (of part W1008) after removal of the short to show a smooth straight line graph.

Figure 4:
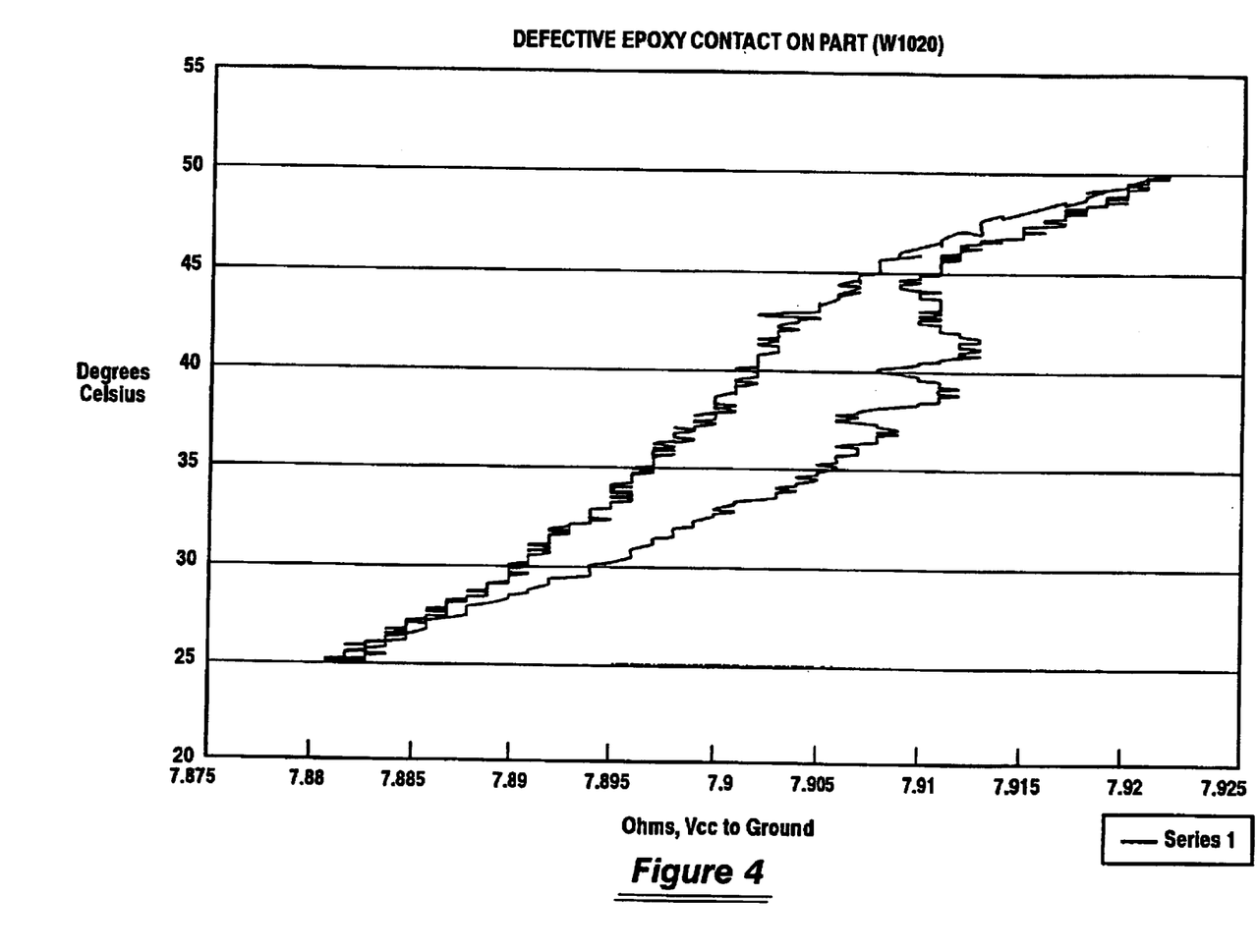
FIG. 4 is another drawing showing a test-run indicating the resistance change as the temperature of the tested module is increased and decreased, so that the relative temperature change provides a specialized resistance pattern which indicates a defective epoxy contact.

Referring to FIG. 4, there is shown a ramp up of temperature range from 20 to 30 degrees Celsius and a ramp down of temperature range from 20 to 30 degrees Celsius wherein the power bus to ground resistance in ohms has a lesser slope on the ramp up and a higher slope on the ramp down which indicates another type of defect such as bad epoxy contact within a component of the multi-chip package.

Figure 5:
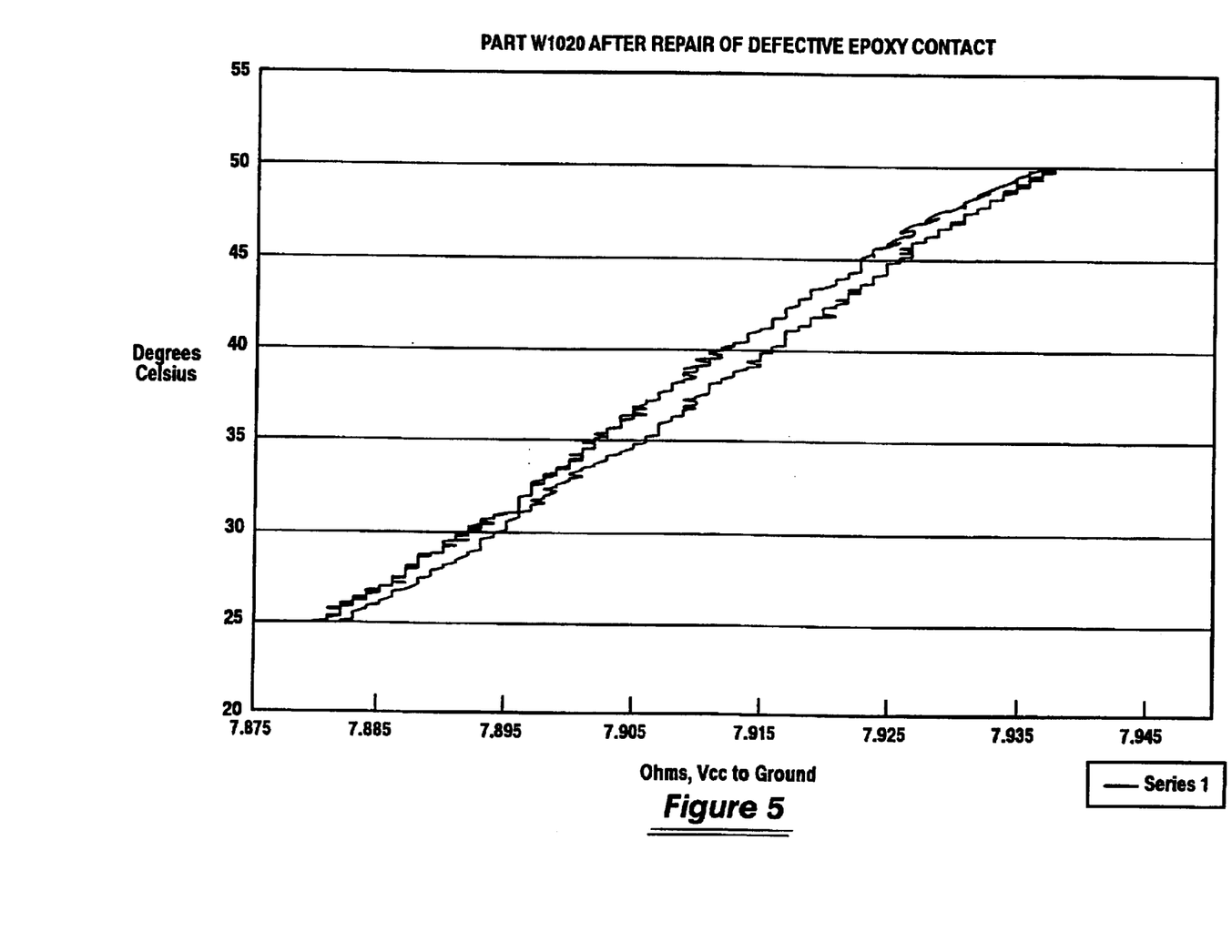
FIG. 5 is a diagram showing a normal or proper result, as for example, after the repair of the defective epoxy contact, such that a very distinct characteristic almost linear resistance pattern is shown when the change in voltage-to-ground resistance is plotted against the relative temperature change which is cycled up and then down.

Now, FIG. 5 is an illustration of a 20 to 30 degree range Celsius ramp up and ramp down in temperature which indicates that the power bus to ground resistance follows a steady slope on the up ramp and a similar slop on the down ramp of temperature, so that there is an indication that the internal component is working in proper condition without any shorts or bad electrical contacts.

In FIGS. 3, 4, and 5, the 7.8 to 7.9 ohm resistance values are the result of the large number of higher value resistive components connected in parallel across the power bus to ground.

The normal room temperature was selected as the starting point for a number of reasons. These include:
(a) To have a consistent and repetitive test with a standard starting point;
(b) To prevent other temperature effects from affecting the tests, such as thermal expansion of mechanical parts;
(c) The Peltier thermal electric module has a maximum operating temperature of 150 degrees Celsius.
(d) The epoxy which is used to attach the components to the integrated circuit package is also limited to a relatively low maximum temperature, so that starting from room temperature to a ramp up and increase of 20 to 30 degrees would not be too severe in straining the integrated circuit package.

Figure 6A:
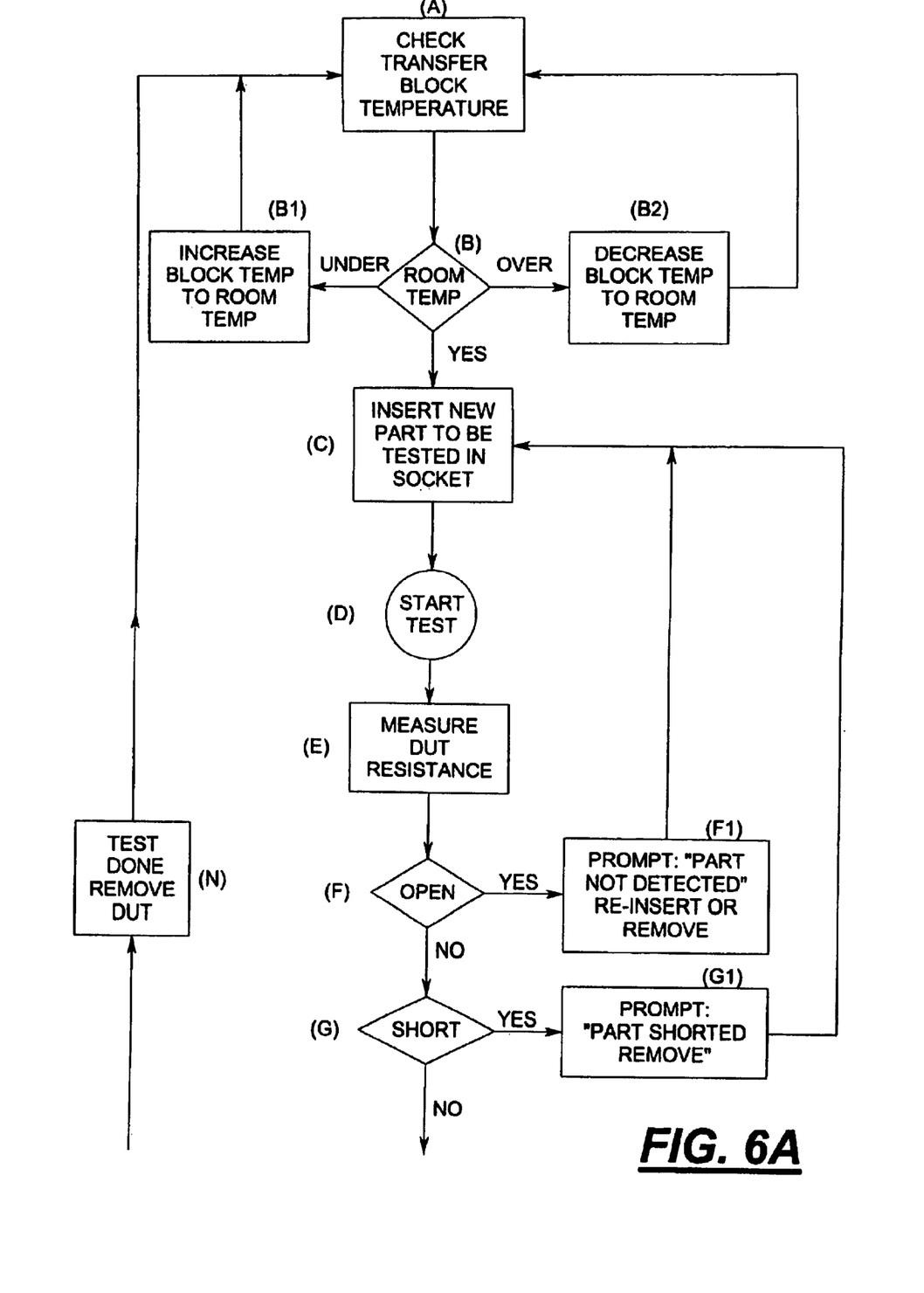
Figure 6B:
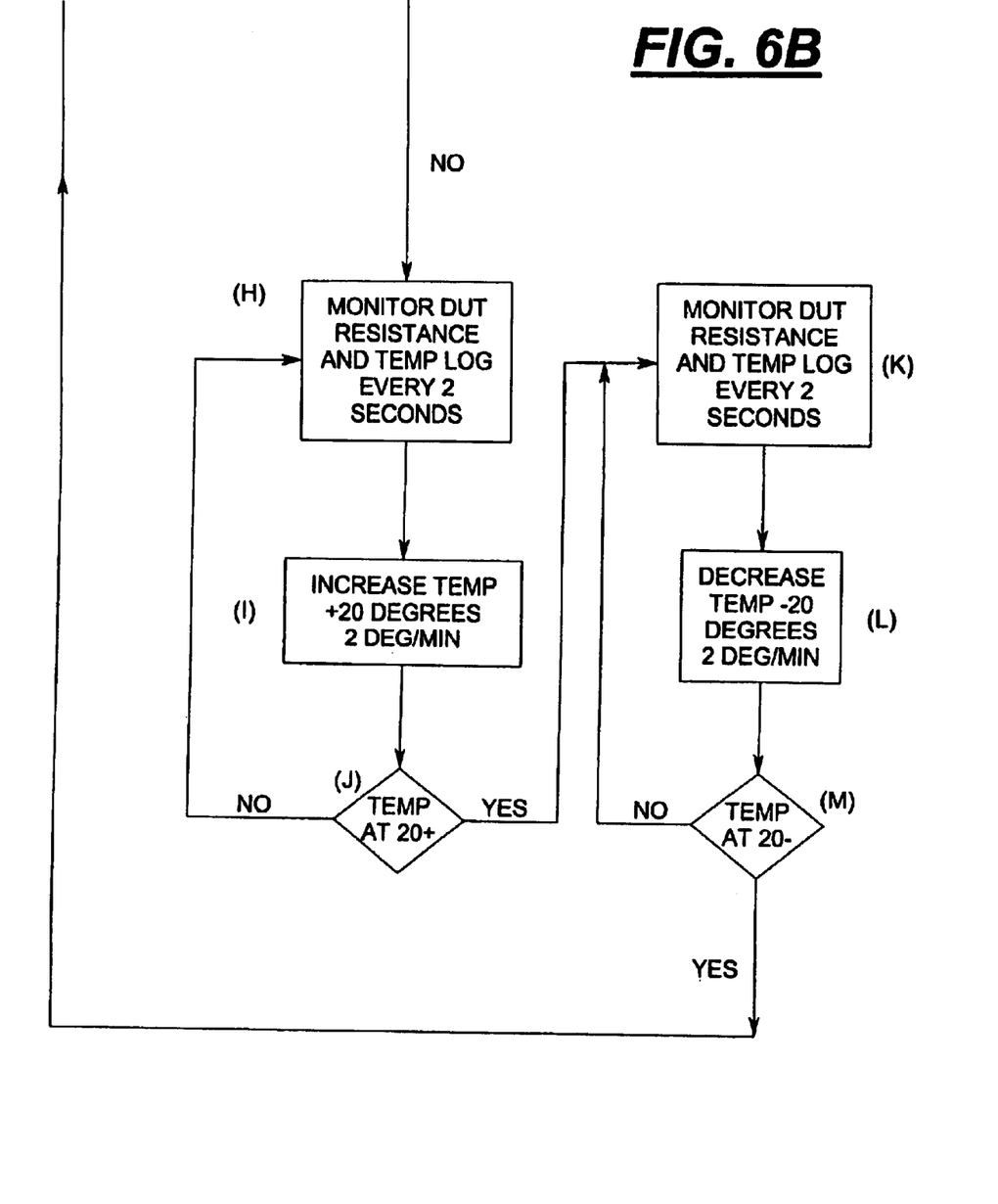

FIG. 6 (which includes 6A and 6B) is a flow chart which illustrates the programmatic steps undertaken by the computer 10 internal program which controls and senses the various elements of the apparatus shown in FIG. 1.

Step A of FIG. 6A is the initial step for checking the temperature of the Transfer Block 26 of FIG. 1.

At step B, the Transfer Block 26 is checked to insure that it is at room temperature and therefore ready for use in testing another component-package. The Transfer Block temperature will be brought to room temperature, if necessary, by the programmable power supply 16 which operates on the Peltier thermal electric module 24. If the transfer block temperature is under room temperature, then step B1 works to increase the transfer block temperature up to room temperature.

If the Transfer Block temperature 26 is determined to be higher or over the room temperature, then step B2 is invoked in order to decrease the Transfer Block temperature 26 down to room temperature, and this is also accomplished by the programmable power supply 16 which operates on the Peltier thermal electric module 24 in order to cause a cooling or endothermic effect to take place.

If the Transfer Block at step B is found to be at room temperature by the temperature meter 14 of FIG. 1, then the device under test 28 is inserted at step C into the test socket 30 of FIG. 1. At step D, the test program is started. When this occurs, the digital multimeter 12 will now be able to check the power bus voltage to ground resistance (Vcc to ground).

This is accomplished at step E, whereby the digital multimeter 12 will be able to measure the power bus to ground resistance during the temperature ramps.

At step F, a check is made for an open circuit which if it is indicated as "Yes", then at step F1 a prompt is given to indicate that the device under test (DUT) cannot be detected. Thus, the device may not be properly inserted or else open-circuited.

At step F, if there is not an open circuit which indicates some resistance, then the indication is "No" in order to proceed to step G. If step F is NO, then step F1 will display a prompt that indicates "Part Not Detected" whereupon the operator can re-insert or remove the part.

At step G, a test is made to indicate whether the power bus to ground is shorted. If this indicates "Yes " the program then proceeds to step G1 where an indication is given that the device under test is shorted and should be removed.

At step G, if no short has been indicated, then the testing process may now proceed on a normal basis. At step H, the monitoring will occur of the DUT 28 (device under test resistance), and also the condition of its temperature every two seconds.

Step H (FIG. 6B) initiates a sequential loop utilizing steps H, I, J where a logging cycle (of temperature and resistance) occurs every 2 seconds during Step I which increases the temperature in 2 degree steps until at step J the temperature has reached a 20 degree change from room temperature. For each NO at step J, the loop continues until the 20 degree change indicates a YES, which then sequences to step K.

At step I, the temperature of the device under test is increased upward over a range of 20° on the basis of 2° per minute. This is done by the programmable power supply 16 which is applied to the Peltier thermal electric module and the aluminum temperature Transfer Block 26 which is attached to the device under test (DUT) 28.

Then at step J, when the temperature has reached a span of +20° from the starting point (Yes), then the computer 10 will monitor the device under test (DUT) 28 resistance and temperature and log out a reading every two seconds during the temperature down ramp which is sequenced through steps K, L and M.

Then steps K, L and M operate as a sequencing loop to log the temperature and resistance while reducing the temperature of the DUT back to room temperature at the rate of 2 degrees per minute. The loop sequence K-L-M repeats until the Transfer Block 26 and the DUT 28 return to room temperature (YES).

Thus, at step L, the temperature is decreased downward over a range of 20° also at the rate of 2° per minute. This is controlled by the temperature meter 14, the programmable power supply 16, the fan power supply 18, and a digital multimeter 12, all under the control of the program in the personal computer 10.

Then at step M, "YES" the down ramp temperature cycle has been completed and the temperature had been reduced by 20° from its peak.

Then FIG. 6A shows step N indicating termination of the test and need remove the DUT 28. A signal is then sent to step A to check the Transfer Block temperature in order to verify it is then at the room temperature, and ready for another DUT to be tested.

During this period, the personal computer 10 has been logging and plotting each resistance and temperature measurement every 2 seconds from steps H, I, J, K, L, M until completion at step N, so that a graph on the screen of the computer 10 will now indicate whether a smooth line transition appears in the up ramp and the down ramp to indicate the integrity and good quality operability of the package.

However, if erratic and non-linear lines appear on the screen of the computer 10, then it is obvious to understand that some type of epoxy short or open circuit has occurred within the package and the package is defective and unsuitable for further use.

Described herein has been a method and apparatus for testing packages of integrated circuit components by programmatically ramping up the temperature a specified amount above room temperature and the ramping down of the device under test (DUT) back to room temperature. This is facilitated by a specially controlled Peltier-junction unit. During the up-ramp and down-ramp cycles, the resistance from power bus to ground is measured and plotted on a computer screen to form a pattern which will indicate component integrity on the on hand, or else the existence of a short circuit or open circuit in one or more components of the package.

Advantageously, a sealed package of internal components can be tested without opening or destroying the package while accomplishing the test checkout in less than 15 minutes.

While a preferred embodiment of the invention has been described, it should be understood that other variations and embodiments may be applied, but which are still encompassed by the attached claims.

What is claimed is:

1. An apparatus for testing internal components of an integrated circuit package device under test to determine normal operation or problem areas in the components, said apparatus comprising:

(a) test socket means for connecting the device under test with a digital multimeter in order to measure the power bus-to ground resistance of the internal components;

(b) temperature transfer block means connected to a temperature meter for placement adjacent said device under test in order to increase the ambient heat or decrease the ambient heat to said device under test;

(c) a Peltier-thermal electric module adjunct said transfer block means and connected to a programmable power supply for controlling the addition of heat to or reduction of heat from said temperature transfer block;

(d) heat sink and fan means placed adjunct to said Peltier thermal electric module and connected to a controlled fan power supply;

(e) computer means having a controll program for connection and management of said controlled fan power supply, said programmable power supply and for sensing operations of said temperature meter and said digital multimeter to controllably enable the sequencing of an up-ramp temperature and a down ramp temperature adjacent said device under test, while concurrently reading-out and plotting the power bus-to ground voltage during the up-cycle and down-cycle of the temperature applied to said device under test.

* * * * *